(12) United States Patent
Nakamura et al.

(10) Patent No.: US 9,647,635 B2
(45) Date of Patent: May 9, 2017

(54) ELASTIC WAVE RESONATORS, AND ELASTIC WAVE FILTERS, ANTENNA DUPLEXERS, MODULES AND COMMUNICATION DEVICES USING SAME

(71) Applicant: SKYWORKS FILTER SOLUTIONS JAPAN CO., LTD, Kadoma-Shi (JP)

(72) Inventors: Hiroyuki Nakamura, Osaka-Fu (JP); Mitsunori Miyanari, Osaka-Fu (JP)

(73) Assignee: SKYWORKS FILTER SOLUTIONS JAPAN CO., LTD., Kadoma-Shi (JP)

( * ) Notice: Subject to any disclaimer, the term of this patent is extended or adjusted under 35 U.S.C. 154(b) by 74 days.

(21) Appl. No.: 14/680,486

(22) Filed: Apr. 7, 2015

(65) Prior Publication Data

US 2015/0288346 A1 Oct. 8, 2015

(30) Foreign Application Priority Data

Apr. 8, 2014 (JP) ................. 2014-079111

(51) Int. Cl.
*H03H 9/72* (2006.01)
*H03H 9/25* (2006.01)
(Continued)

(52) U.S. Cl.
CPC ....... *H03H 9/14564* (2013.01); *H01L 41/047* (2013.01); *H03H 9/1457* (2013.01);
(Continued)

(58) Field of Classification Search
CPC ........... H03H 9/02708; H03H 9/02818; H03H 9/02834; H03H 9/1452; H03H 9/14544;
(Continued)

(56) References Cited

U.S. PATENT DOCUMENTS 5,717,274 A * 2/1998 Eguchi ............... G06G 7/195
310/313 B
5,831,492 A 11/1998 Solie
(Continued)

FOREIGN PATENT DOCUMENTS

DE 2656154 A1 7/1977
EP 1489741 A1 12/2004
(Continued)

OTHER PUBLICATIONS

English language machine translation of JP 2003-087083, published Mar. 20, 2003, 7 pages.*
International Search Report and Written Opinion from corresponding PCT Application Serial No. PCT/JP2015/001956, mailed Jun. 25, 2015.

*Primary Examiner* — Barbara Summons
(74) *Attorney, Agent, or Firm* — Lando & Anastasi, LLP

(57) ABSTRACT

An elastic wave resonator including comb-shaped electrodes and reflector electrodes formed on a piezoelectric substrate. In one example, an overlapping portion between the comb-shaped electrodes includes a first overlapping region and second overlapping regions. The second overlapping regions can be provided on both outside edges of the first overlapping region. In one example, the overlapping width of the first overlapping region is greater than the overlapping width of the second overlapping region, and the electrode finger pitch in the second overlapping region is greater than the electrode finger pitch in the first overlapping region.

19 Claims, 10 Drawing Sheets

(51) Int. Cl.
*H03H 9/64* (2006.01)
*H03H 9/145* (2006.01)
*H01L 41/047* (2006.01)
*H03H 9/205* (2006.01)
*H03H 9/02* (2006.01)

(52) U.S. Cl.
CPC .............. *H03H 9/25* (2013.01); *H03H 9/64* (2013.01); *H03H 9/725* (2013.01); *H03H 9/02708* (2013.01); *H03H 9/1452* (2013.01); *H03H 9/205* (2013.01)

(58) Field of Classification Search
CPC .. H03H 9/14564; H03H 9/1457; H03H 9/205; H03H 9/25; H03H 9/64; H03H 9/6433; H03H 9/725; H01L 41/047
USPC .......................................... 333/133, 193–196
See application file for complete search history.

(56) References Cited

U.S. PATENT DOCUMENTS

| | | |
|---|---|---|
| 5,973,438 A | 10/1999 | Toda |
| 2004/0246076 A1* | 12/2004 | Bergmann ......... H03H 9/02685 333/193 |
| 2012/0286624 A1 | 11/2012 | Ikeuchi |
| 2013/0278358 A1 | 10/2013 | Tsuda et al. |

FOREIGN PATENT DOCUMENTS

| | | | |
|---|---|---|---|
| JP | S60180316 A | | 9/1985 |
| JP | 2003-087083 A | * | 3/2003 |

* cited by examiner

ELASTIC WAVE RESONATORS, AND ELASTIC WAVE FILTERS, ANTENNA DUPLEXERS, MODULES AND COMMUNICATION DEVICES USING SAME

CROSS-REFERENCE TO RELATED APPLICATIONS

This application claims the benefit under 35 U.S.C. §119(a) and PCT Article 8 to co-pending Japanese Patent Application No. 2014-079111 filed on Apr. 8, 2014, which is hereby incorporated by reference herein in its entirety for all purposes.

FIELD OF INVENTION

Aspects and embodiments relate generally to an elastic wave resonator, and an elastic wave filter, an antenna duplexer, a module, and a communication device using the same.

BACKGROUND

An elastic wave device implemented using a 42 degree-rotated Y-cut lithium tantalate piezoelectric substrate has been commonly used for a filter and an antenna duplexer of a communication device. The elastic wave device is configured to use a plurality of comb-shaped electrodes (also referred to as interdigital transducer (IDT) electrodes) formed on the piezoelectric substrate. Recently, there has been a need for an elastic wave device having higher performance and better temperature characteristics. One approach to realizing such an elastic wave device involves making the piezoelectric substrate of lithium niobate and providing a silicon oxide film on the IDT electrode so that the temperature characteristic can be improved. This was expected to provide a higher Q at resonance, especially in an elastic wave device using lithium niobate that has a cut angle for the primary elastic wave to be a Rayleigh wave. However, spuriousness such as a spurious response in the transverse mode, and a spurious response due to an undesired wave other than the Rayleigh wave as the primary elastic wave can be caused by a plurality of factors in such an elastic wave device. This spuriousness can degrade the filtering characteristics of the elastic wave device.

FIG. 19 illustrates an example of the configuration of a conventional elastic wave resonator. In the example illustrated in FIG. 19, the elastic wave resonator has comb-shaped electrodes 1902 and reflector electrodes 1903 that are formed on a piezoelectric substrate 1901. This configuration experiences problematic spuriousness in the transverse mode, particularly when the piezoelectric substrate of the elastic wave resonator is made of lithium niobate.

A conventional approach to solving the spuriousness problem in elastic wave resonators such as that shown in FIG. 19 includes using apodization in the elastic wave resonator. For example, FIG. 20 illustrates a configuration of a conventional elastic wave resonator including apodization. In the example shown in FIG. 20, the elastic wave resonator has comb-shaped electrodes 2002 and reflector electrodes 2003 that are formed on a piezoelectric substrate 2001. Here, the comb-shaped electrode 2002 has apodization to suppress spuriousness in the transverse mode, as described, for example, in US patent application publication No. 2011/0068655.

SUMMARY OF INVENTION

Conventional elastic wave resonators, such as that shown in FIG. 20, for example, suffer from degraded characteristics caused by a Q-value degradation due to the apodization, and further may be of an undesirably large size when the apodization is used. Still further, when the elastic wave resonator is used as an elastic wave filter, the elastic wave filter may suffer from degraded insertion loss and degraded attenuation characteristics.

Accordingly, aspects and embodiments are directed to a relatively smaller (downsized) elastic wave resonator having less spuriousness in the transverse mode and improved characteristics. Additional aspects and embodiments are directed to providing an elastic wave filter and an antenna duplexer using such an elastic wave resonator, as well as a module and a communication device using the same.

One embodiment is directed to an elastic wave resonator including a piezoelectric substrate and a comb-shaped electrode provided on an upper surface of the substrate, the comb-shaped electrode including a first overlapping region and a second overlapping region, the second overlapping region being provided on the outside of the first overlapping region in an overlapping width direction, an overlapping width of the first overlapping region being greater than an overlapping width of the second overlapping region, and an electrode finger pitch in the second overlapping region being greater than an electrode finger pitch in the first overlapping region. According to this configuration, an elastic wave resonator having improved characteristics, including less spuriousness, may be advantageously realized.

Various embodiments of the elastic wave filter may include any one or more of the following features.

In one example, the elastic wave filter is configured such that a frequency of an elastic wave excited in the second overlapping region is less than a frequency of an elastic wave excited in the first overlapping region.

In another example, electrode fingers in the first overlapping region and electrode fingers in the second overlapping region are connected via first connection electrode fingers, the first connection electrode fingers being configured to obliquely extend with respect to a direction in which the electrode fingers extend in the first overlapping region.

The elastic wave resonator may further include a dummy region in which the electrode fingers do not overlap with each other. In one example, the electrode fingers in the first overlapping region and the electrode fingers the second overlapping region are connected via first connection electrode fingers provided in a first connection region. The electrode fingers in the second overlapping region and the electrode fingers in the dummy region can be connected via second connection electrode fingers provided in a second connection region. In one example, the first connection electrode fingers and the second connection electrode fingers obliquely extend with respect to a first direction in which the electrode fingers extend in the first overlapping region, and the first direction is opposite to a second direction in which the second connection electrode fingers extend. In another example, the dummy region has an electrode finger pitch greater than the electrode finger pitch in the first overlapping region. The electrode fingers of the comb-shaped electrode can be connected to a busbar electrode, a propagation direction length of which is greater than a propagation direction length of the first overlapping region.

In another example, a width of electrode fingers in the second overlapping region is greater than a width of electrode fingers in the first overlapping region.

In another example, the first overlapping region includes a first number of electrode fingers, and the second overlapping region includes a second number of electrode fingers, fewer than the first number of electrode fingers.

In another example, the second overlapping region includes a first phase region and a second phase region, a phase of an elastic wave generated by the electrode fingers of the first phase region being different from a phase of an elastic wave generated by the electrode fingers of the second phase region.

According to any of the above configurations, an elastic wave resonator having improved characteristics, including less spuriousness, can be advantageously realized.

The elastic wave resonator may further include a thin dielectric film made of $SiO_2$ disposed over the comb-shaped electrode. According to this configuration, an elastic wave resonator having an improved and better temperature characteristic can be advantageously realized.

In one example, the piezoelectric substrate is made of lithium niobate and has a cut angle ranging from 120 degrees to 135 degrees in Y-cut. According to this configuration, an elastic wave resonator having improved characteristics, including less spuriousness, when the primary elastic wave is Rayleigh wave can be advantageously realized.

Another embodiment is directed to an elastic wave filter including a plurality of elastic wave resonators, at least one of the elastic wave resonators being an elastic wave resonator according to any one of the above-discussed embodiments, examples, or configurations. Accordingly, an elastic wave filter having an improved characteristic can be realized.

Another embodiment is directed to a longitudinal-mode elastic wave filter including a plurality of elastic wave resonators disposed adjacent to one other in a propagation direction of an elastic wave in the elastic wave filter, at least one of the elastic wave resonators being an elastic wave resonator according to any one of the above-discussed embodiments, examples, or configurations. Accordingly, an elastic wave filter having an improved characteristic can be advantageously realized.

According to another embodiment, an antenna duplexer includes a transmission filter and a reception filter, at least one of the transmission filter and the reception filter being an elastic wave filter according to any of the above-discussed embodiments. According to this embodiment, an antenna duplexer having an improved characteristic can be advantageously realized.

Another embodiment is directed to a module including an elastic wave filter or antenna duplexer according to any of the above-discussed embodiments. According to this embodiment, a module having an improved characteristic can be advantageously realized.

Another embodiment is directed to a communication device including an elastic wave filter or antenna duplexer according to any of the above-discussed embodiments. According to this embodiment, a communication device having an improved characteristic can be advantageously realized.

According to another embodiment, an elastic wave filter comprises a piezoelectric substrate and a plurality elastic wave resonators disposed on an upper surface of the piezoelectric substrate, each elastic wave resonator including a comb-shaped electrode having a first overlapping region and a second overlapping region, the second overlapping region being provided on outside edges of the first overlapping region in an overlapping width direction, an overlapping width of the first overlapping region being greater than an overlapping width of the second overlapping region, and an electrode finger pitch in the second overlapping region being greater than an electrode finger pitch in the first overlapping region.

As described above, embodiments of the elastic wave resonator in accordance with the present invention can achieve the effect of realizing a downsized elastic wave resonator having less spuriousness in the transverse mode and improved characteristics. Further, configuring an elastic wave filter and an antenna duplexer to use such an elastic wave resonator can achieve the effect of realizing a downsized elastic wave filter and antenna duplexer having improved characteristics. Still further, configuring a module and a communication device to use such an elastic wave filter and an antenna duplexer can achieve the effect of realizing a downsized module and communication device having improved characteristics.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Various aspects and embodiments of the present invention are described below with reference to the drawings.

Figure 1:
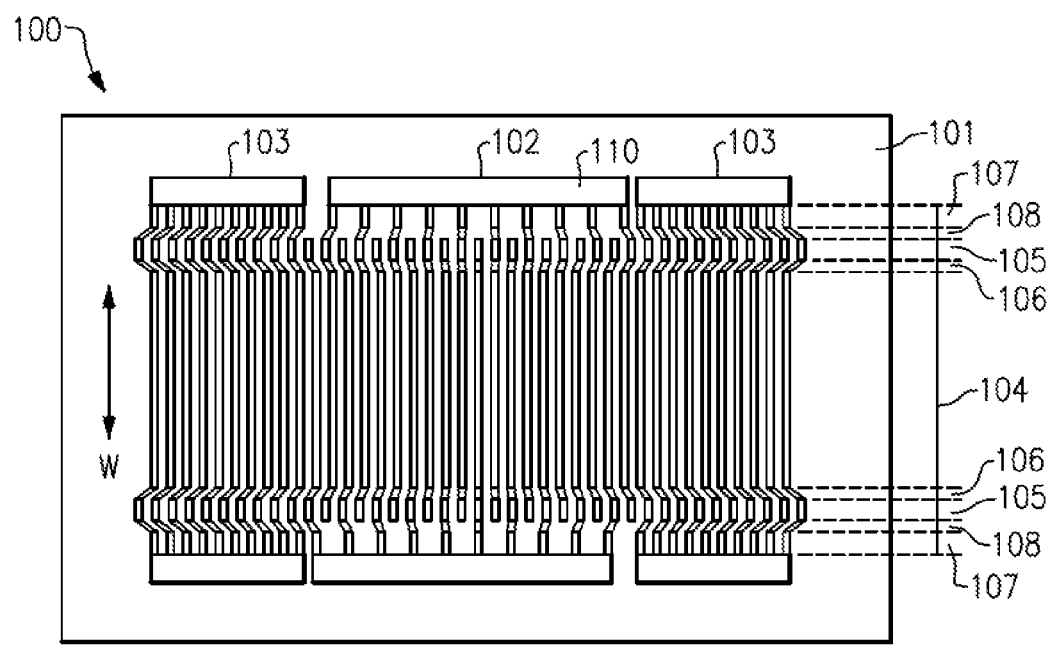
FIG. 1 is a diagram illustrating one example of an elastic wave resonator according to one embodiment.

Referring to FIG. 1, there is illustrated one example of an elastic wave resonator 100 according to one embodiment. In the example illustrated in FIG. 1, the elastic wave resonator includes comb-shaped electrodes 102 and reflector electrodes 103 that are formed on a piezoelectric substrate 101. The elastic wave resonator 100 is configured with an overlapping portion between the comb-shaped electrodes 102 to excite an elastic wave, the overlapping portion including a first overlapping region 104 and second overlapping regions 105. The second overlapping regions 105 are provided on both outside edges of the first overlapping region 104, as shown in FIG. 1. The electrode fingers of the first overlapping region 104 and the electrode fingers of the second overlapping regions 105 are connected via first connection electrode fingers 106. The first connection electrode fingers 106 are provided in first connection regions, each of which is located between the first overlapping region 104 and the second overlapping region 105. Further, the electrode fingers of the second overlapping region 105 and the electrode fingers of a dummy region 107 are connected via second connection electrode fingers 108. The second connection electrode fingers 108 are provided in second connection regions, each of which is located between the second overlapping region 105 and the busbar electrode 110. As used herein, the dummy region 107 refers to a region where the electrode fingers do not overlap with each other between the comb-shaped electrodes 102. In the example illustrated in FIG. 1, the first connection electrode fingers 106 and the second connection electrode fingers 108 are connected in a direction oblique with respect to the direction in which the electrode fingers of the comb-shaped electrode 102 extend. Further, the direction in which the first connection electrode fingers 106 extend is opposite to the direction in which the second connection electrode fingers 108 extend. As a result, the electrode fingers of the first overlapping region 104 are arranged collinear with the electrode fingers of the dummy region 107.

The first overlapping region 104 is a primary portion for exciting an elastic wave to obtain desired frequency characteristics. In one example, the overlapping width (W) of the first overlapping region 104 is greater than the overlapping width of the second overlapping region 105. Additionally, the electrode finger pitch of the second overlapping region 105 may be greater than the electrode finger pitch of the first overlapping region 104, and as a result, the frequency of an elastic wave excited in the second overlapping region 105 may be lower than the frequency of an elastic wave excited in the first overlapping region 104. As used herein, the electrode finger pitch refers to the distance between the centers of adjacent electrode fingers.

Figure 2:
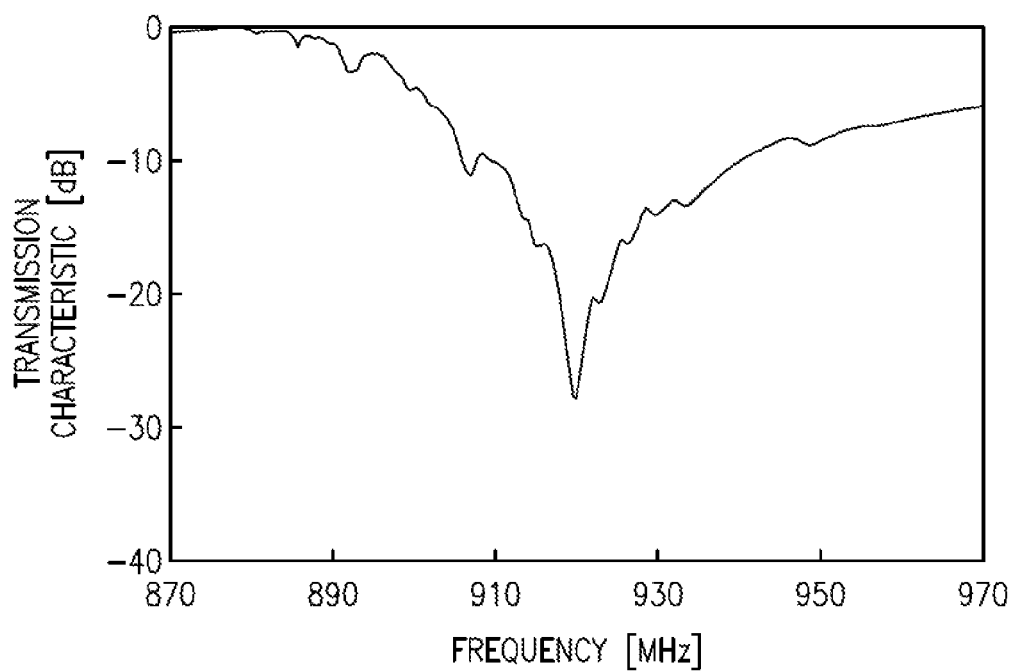
FIG. 2 is a transmission characteristic diagram corresponding to an example of the elastic wave resonator of FIG. 1.
Figure 3:
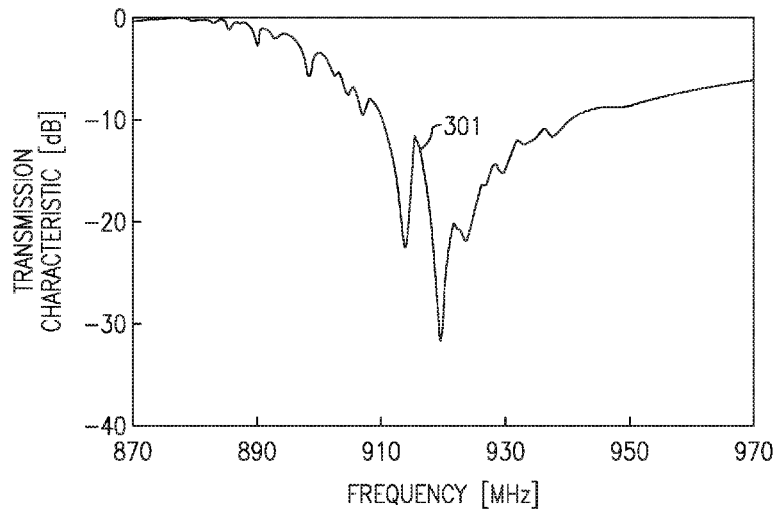
FIG. 3 is a transmission characteristic diagram according to the conventional elastic wave resonator of FIG. 19.
Figure 19:
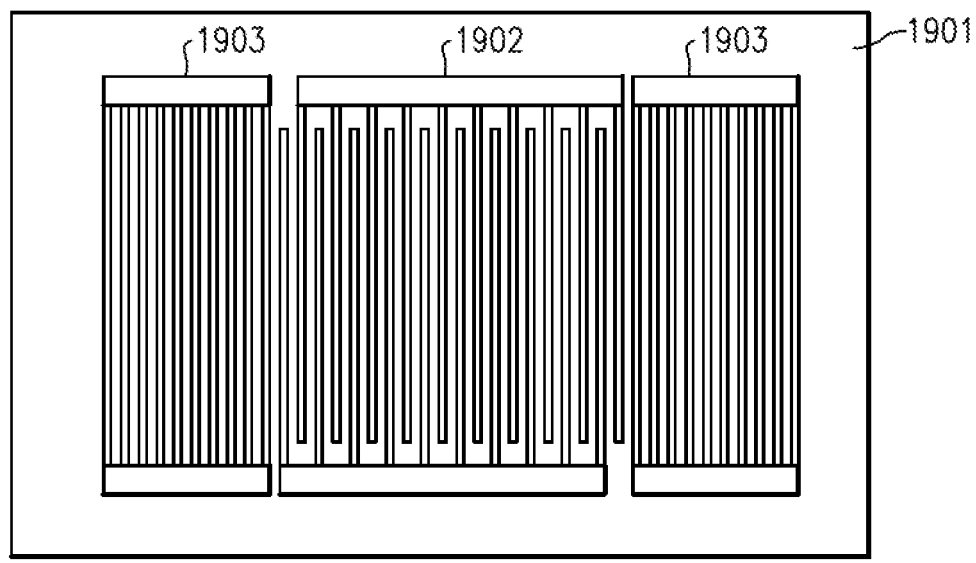
FIG. 19 is a diagram illustrating one configuration of a conventional elastic wave resonator.
Figure 20:
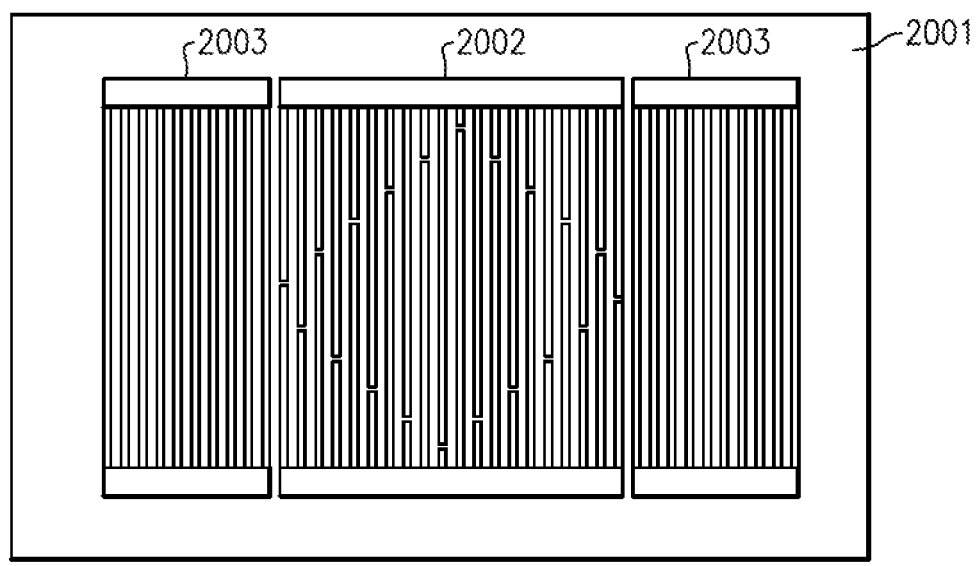
FIG. 20 is a diagram illustrating another configuration of a conventional elastic wave resonator.

FIG. 2 illustrates a transmission characteristic for the elastic wave resonator of FIG. 1. For comparison, FIG. 3 illustrates a transmission characteristic for the conventional elastic wave resonator of FIG. 19. In the example of the elastic wave resonator 100 corresponding to FIG. 2, a 128-degree $LiNbO_3$ substrate is used for the piezoelectric substrate so that the primary elastic wave can be a Rayleigh wave. In this example, the electrode finger pitch of the first overlapping region 104 is 2.00 μm, and the electrode finger pitch of the second overlapping region 105 is 2.02 μm. Additionally, the number of electrode fingers of the comb-shaped electrode 102 is one hundred (100), and the number of the electrode fingers of the reflector 103 is thirty (30). Furthermore, in this example, the metallization ratio of the electrode fingers of the second overlapping region 105 is the same as that of the electrode fingers of the first overlapping region 104. The metallization ratio is defined as the electrode finger width/(the electrode finger width+the space between the electrode fingers). As discussed above, in one example, the electrode finger pitch of the second overlapping region 105 is configured to be greater than that of the first overlapping region. Accordingly, the width of the electrode fingers in the second overlapping region 105 is greater than the width of the electrode fingers in the first overlapping region 104. As shown in FIG. 3, in the conventional elastic wave resonator, greater spuriousness 301 occurs on the lower side of the antiresonant frequency in the transmission characteristic of the conventional elastic wave resonator. In contrast, as shown in FIG. 2, examples of the elastic wave resonator 100 according to embodiments of the present invention can suppress spuriousness. The suppression of spuriousness can be attributed to the configuration in which the frequency of an elastic wave excited in the second overlapping region 105 is lower than the frequency of an elastic wave excited in the first overlapping region 104, achieved by increasing the electrode finger pitch of the second overlapping region 105 in comparison with the electrode finger pitch of the first overlapping region 104.

As discussed above, embodiments of the elastic wave resonator according to aspects of the present invention can suppress spuriousness in the transmission characteristic of the elastic wave resonator such that a downsized elastic wave resonator having improved characteristics can be realized.

Figure 4:
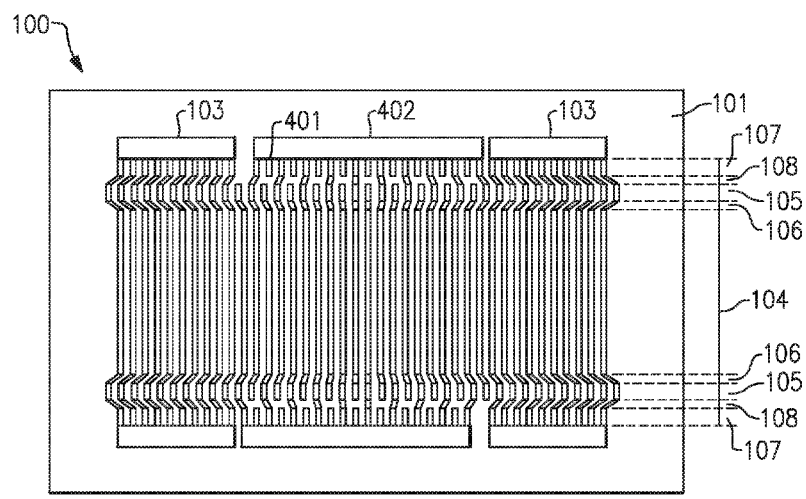
FIG. 4 is a diagram illustrating another configuration of an example of the elastic wave resonator of FIG. 1.

Certain embodiments of the elastic wave resonator 100 are configured to eliminate dummy electrode fingers (electrode fingers that do not extend to the second overlapping region 105) in the dummy region 107 of the comb-shaped electrode 102. However, other embodiments can use comb-shaped electrodes 402 provided with such dummy electrode fingers, as shown in FIG. 4, for example.

In addition, although in certain embodiments the electrode finger pitch is greatest in the second overlapping region 105, in other examples, comb-shaped electrodes 502 and reflector electrodes 503 can be used in which the electrode finger pitch is greatest in the dummy region 501.

Figure 5:
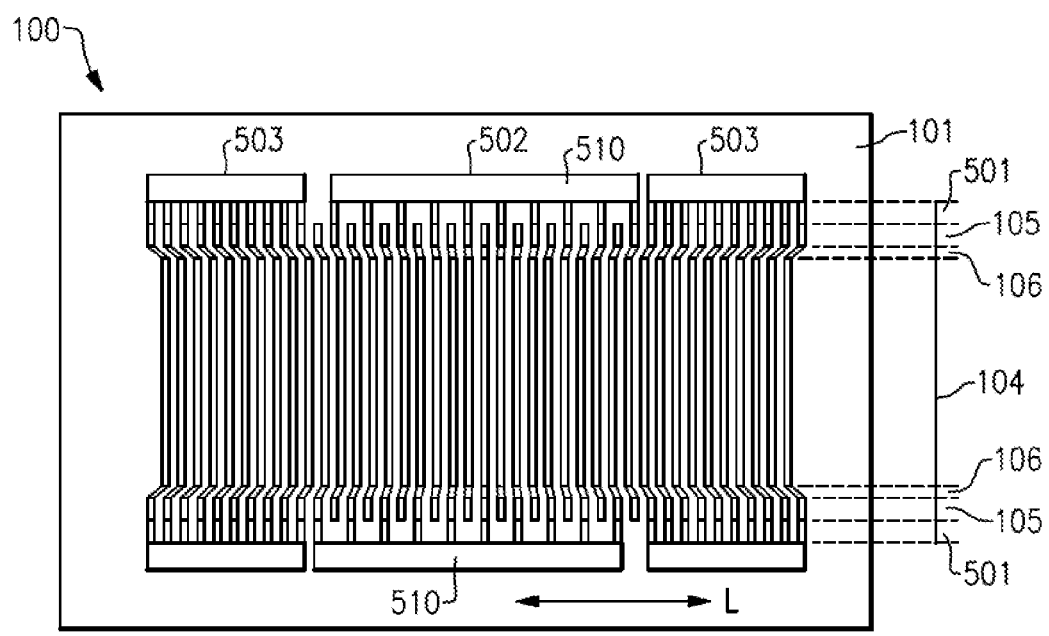
FIG. 5 is a diagram illustrating another configuration of an example of the elastic wave resonator of FIG. 1.

An example of this configuration is illustrated in FIG. 5. In this example, the propagation direction length of the busbar electrode 510 connected to the electrode fingers of the comb-shaped electrode 502 is greater than the propagation direction length (L) of the first overlapping region 104 of the comb-shaped electrode 502. This configuration can eliminate the second connection electrode fingers 108, which may allow the overlapping width to be reduced.

Figure 6:
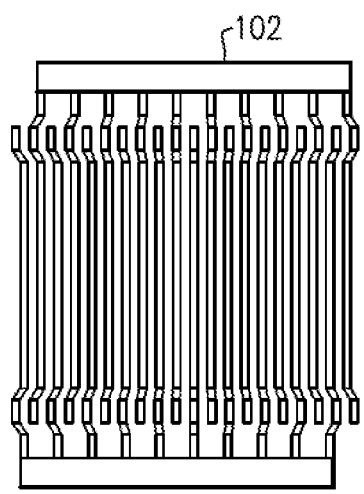
FIG. 6 is a diagram illustrating one example of comb-shaped electrodes for one embodiment of the elastic wave resonator of FIG. 1.
Figure 7:
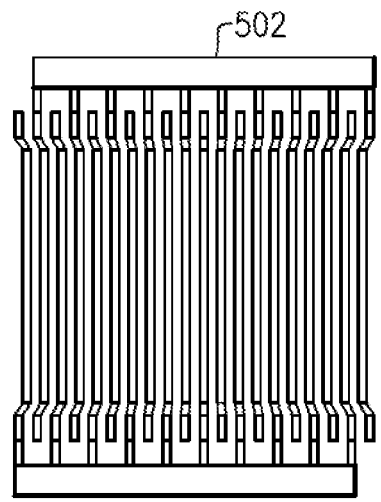
FIG. 7 is a diagram illustrating another example of comb-shaped electrodes for another embodiment of the elastic wave resonator of FIG. 1.

Furthermore, similar effects can be achieved using other configurations of the comb-shaped electrodes 102, 502, such as those illustrated in FIGS. 6 and 7, for example. Still further, similar effects can be achieved in a longitudinal-mode-type elastic surface wave filter in which a plurality of comb-shaped electrodes (i.e., including comb-shaped electrodes similar to any of the comb-shaped electrodes 102, 402, 502, etc.) are adjacently arranged in the propagation direction of an elastic wave.

As discussed above, in certain examples a Y-cut 128-degree $LiNbO_3$ substrate is used for the piezoelectric substrate of the elastic wave filter; however, embodiments of the elastic wave resonator are not limited in this regard, and other piezoelectric substrates can be used. For example, suppression of spuriousness in the transverse mode can be achieved by embodiments of the elastic wave filter of FIG. 1 using a $LiNbO_3$ substrate wherein the cut angle ranges from 120 degrees to 135 degrees in Y-cut, such that an elastic wave resonator having improved characteristics can be realized.

In addition, the material of the electrodes is not limited to the specific examples disclosed herein, and a layered structure of high density electrodes with Aluminum-based materials, or a single layer electrode can be implemented.

Furthermore, the number of the comb-shaped electrodes and reflector electrodes and the electrode finger pitch are not limited to the specific examples disclosed herein. Although certain embodiments include second overlapping regions 105 that are the same and provided on both sides in the overlapping width direction of the first overlapping region 104, in other examples, the second overlapping regions 105 differ from one another. Similar effects can be achieved at least by a configuration in which the frequency of an elastic wave excited by the second overlapping regions 105 is lowered in comparison with that of an elastic wave excited by the first overlapping region 104.

As discussed above, in certain examples the elastic wave resonator 100 is configured such that the electrode finger pitch of the second overlapping region 105 is greater than the electrode finger pitch of the first overlapping region 104 throughout the whole region of the comb-shaped electrode in the propagation direction of an elastic wave. However, other embodiments can have different configurations, and the specific examples disclosed herein are not intended to be limiting. For example, the electrode finger pitch of the second overlapping region 105 can be the same as or less than the electrode finger pitch of the first overlapping region 104 around both edges of the comb-shaped electrode in the propagation direction of an elastic wave (in portions adjacent to the reflectors 103). Thus, even though the magnitude relationship varies between the electrode finger pitches in a portion of the comb-shaped electrode, the effects discussed above can be achieved provided that the frequency of an elastic wave excited by the second overlapping region 105 is lower than the frequency of an elastic wave excited by the first overlapping region 104. Similarly, a portion lacking the second overlapping region can be included in a portion of the comb-shaped electrode.

Although in some examples the metallization ratios are the same between the first overlapping region 104 and the second overlapping region 105, in other examples the metallization ratios can be different. A similar effect can be obtained provided that the frequency of an elastic wave in the second overlapping region 105 is lower than the frequency of an elastic wave in the first overlapping region 104.

It will be appreciated by those skilled in the art, given the benefit of this disclosure, that configuring a filter and an antenna duplexer to use embodiments of the elastic wave resonator 100 according to this disclosure can realize a filter and/or an antenna duplexer having less spuriousness in the transverse mode and improved characteristics, as well as a module and a communication device having enhanced performance using the same, as discussed further below.

Figure 8:
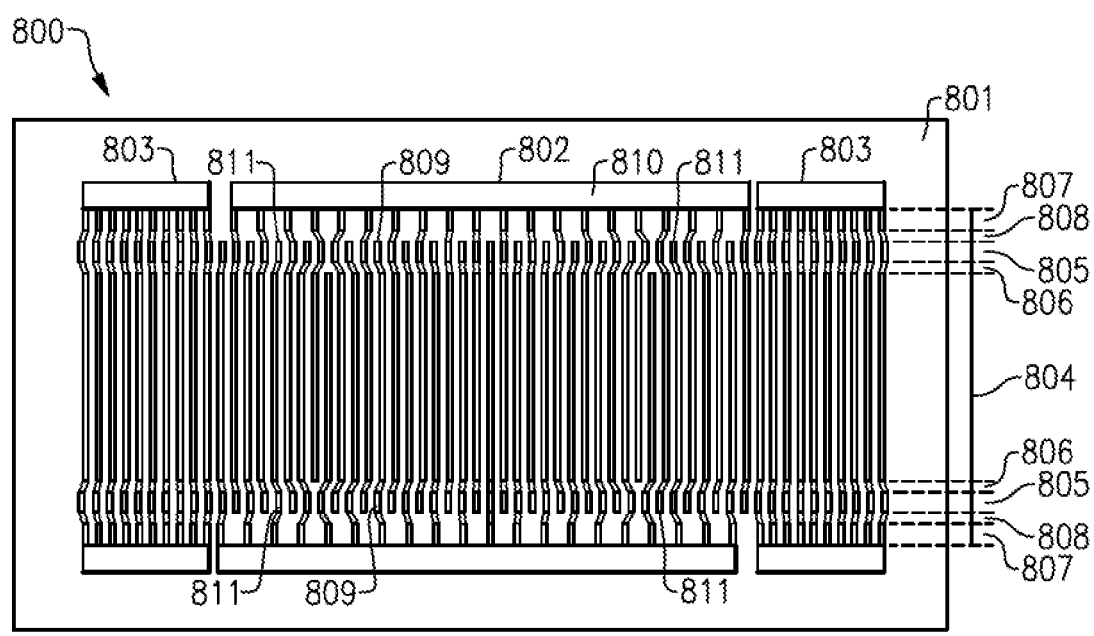
FIG. 8 is a diagram illustrating one example of an elastic wave resonator according to another embodiment.

Referring to FIG. 8, there is illustrated another embodiment of an elastic wave resonator 800. As shown in FIG. 8, the configuration of this example includes first phase region electrode fingers 809 and second phase region electrode fingers 811, the phase of an elastic wave generated by the first phase region electrode fingers 809 being different from the phase of an elastic wave generated by the second phase region electrode fingers 811. In this example, the electrode fingers of the first overlapping region 804 connected to the first phase region electrode fingers 809 have a 180-degree difference relationship with the electrode fingers of the first overlapping region 804 connected to the second phase region electrode fingers 811. As a result, the phase of an elastic wave in the first phase region is different from the phase of an elastic wave in the second phase region. In one example, in order to realize the configuration, the first and the second connection electrode fingers 806, 808 are connected in a direction opposite and oblique with each other to the first and the second phase region electrode fingers 809, 811.

Figure 9:
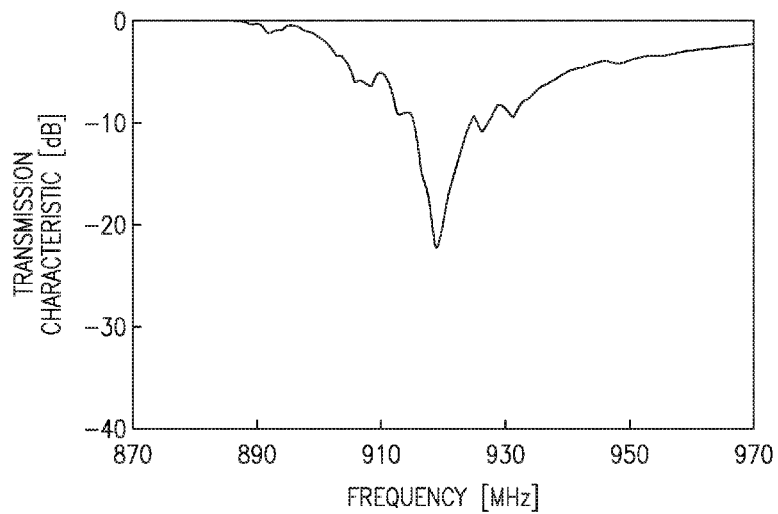
FIG. 9 is a transmission characteristic diagram corresponding to an example of the elastic wave resonator of FIG. 8.
Figure 10:
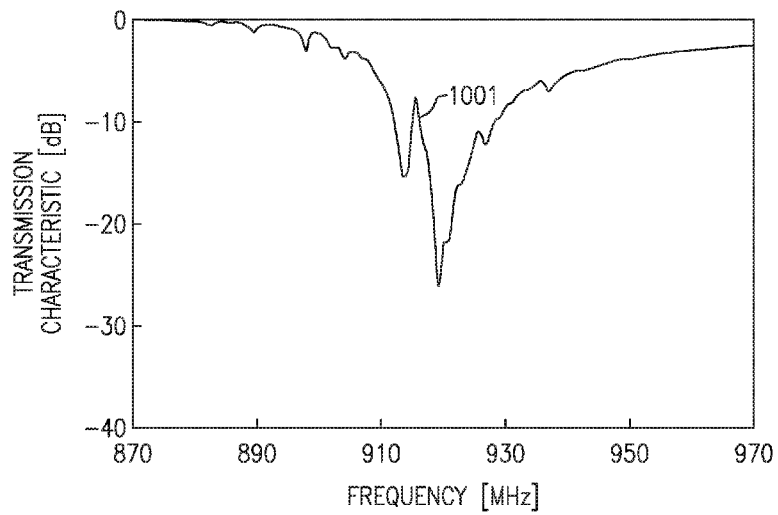
FIG. 10 is a transmission characteristic diagram according to a conventional elastic wave resonator.

FIG. 9 shows a transmission characteristic for one example of the elastic wave resonator 800 of FIG. 8. For comparison, FIG. 10 shows a transmission characteristic according to the conventional elastic wave resonator of FIG. 19. In the example corresponding to FIG. 9, a 128-degree $LiNbO_3$ substrate is used for the piezoelectric substrate so that a Rayleigh wave is the primary elastic wave. In this example, the electrode finger pitch of the first overlapping region 804 is 2.00 µm, and the electrode finger pitch of the second overlapping region 805 is 2.02 µm. Additionally, the number of the electrode fingers of the comb-shaped electrode is two hundred (200), and the number of the electrode fingers of the reflector is thirty (30). As shown in FIG. 10, greater spuriousness 1001 occurs on the lower side of the anti-resonant frequency in the transmission characteristic of the conventional elastic wave resonator. In contrast, as shown in FIG. 9, embodiments of the elastic wave resonator 800 according to aspects of the present invention can suppress the spuriousness. The suppression of the spuriousness can be attributed to the configuration in which the frequency of an elastic wave excited in the second overlapping region 805 is lower than the frequency of an elastic wave excited in the first overlapping region 804, achieved, for example, by increasing the electrode finger pitch of the second overlapping region 805 in comparison with the electrode finger pitch of the first overlapping region 804.

As discussed above, embodiments of the elastic wave resonator 800 can suppress spuriousness in the transmission characteristic of the elastic wave resonator so that an improved elastic wave resonator can be realized. Furthermore, configuring the comb-shaped electrode 802 to have the number of the electric fingers in the second overlapping region 805 be less than that of the first overlapping region 804 can prevent defectively formed electrodes caused by the first and the second connection electrodes 807, 808 being too thin to perform sufficient exposure, etching and the like.

Figure 11:
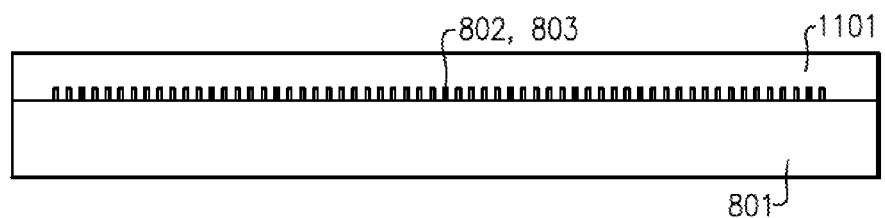
FIG. 11 is a cross-sectional view of the elastic wave resonator of FIG. 8.
Figure 12:
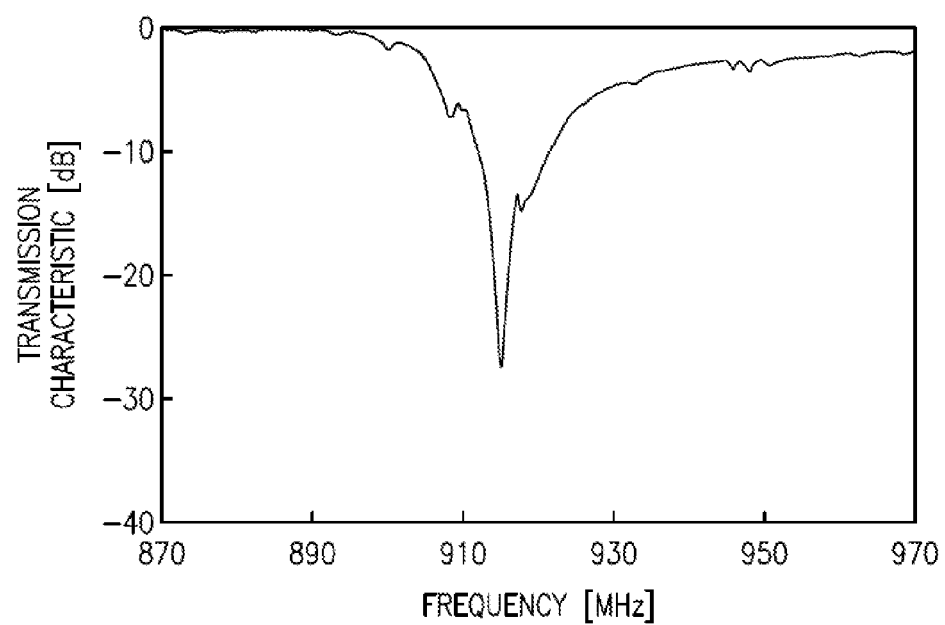
FIG. 12 is a transmission characteristic diagram corresponding to one example of the elastic wave resonator of FIG. 11.
Figure 13:
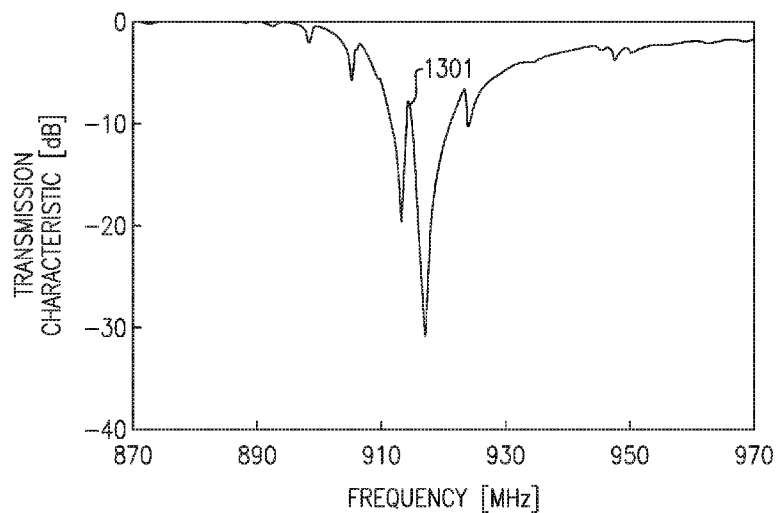
FIG. 13 is a transmission characteristic diagram according to a conventional elastic wave resonator.

In addition, as shown in FIG. 11, in certain examples, the comb-shaped electrode 802 and the reflector electrodes 803 may be covered with a dielectric thin film 1101. FIG. 12 shows a transmission characteristic of an example of the elastic wave resonator when a $SiO_2$ thin film is used for the dielectric thin film 1101. The thickness of the $SiO_2$ thin film can be approximately 33% of the normalized wavelength. For comparison, FIG. 13 shows a transmission characteristic for an example in which the comb-shaped electrodes and the reflector electrodes of a conventional elastic wave resonator are covered with a $SiO_2$ thin film. As shown in FIG. 13, greater spuriousness 1301 occurs on the lower side of the anti-resonant frequency in the transmission characteristic of the conventional elastic wave resonator. In contrast, as shown in FIG. 12, embodiments of the elastic wave resonator 800 according to aspects of the present invention can suppress the spuriousness even when the coating of a $SiO_2$ thin film exists. Further, the elastic wave resonator 800 according to embodiments disclosed herein can improve the temperature characteristic of the elastic wave resonator, and devices including such elastic wave resonators with the $SiO_2$ thin film.

Certain embodiments of the elastic wave resonator 800 are configured to eliminate dummy electrode fingers in the dummy region 807 of the comb-shaped electrode 802. However, other embodiments can use comb-shaped electrodes 402 provided with such dummy electrode fingers, similar to the example as shown in FIG. 4.

Figure 14:
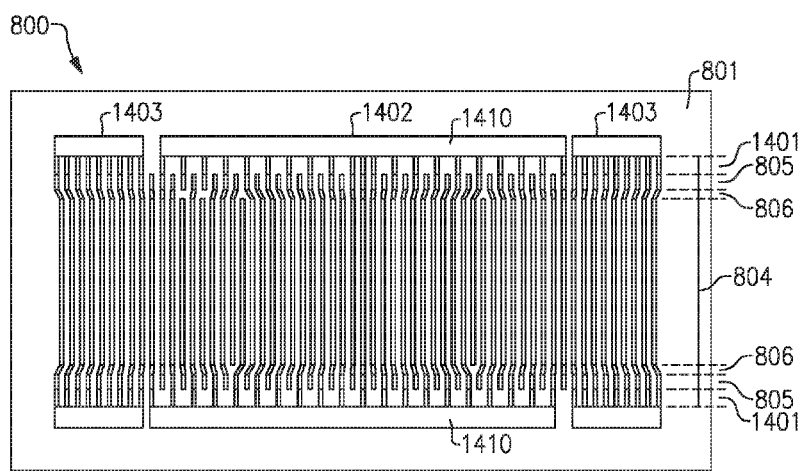
FIG. 14 is a diagram illustrating another configuration of an example of the elastic wave resonator of FIG. 8.

In addition, although in certain examples, the electrode finger pitch is greatest in the second overlapping region 805; other examples can use comb-shaped electrodes 1402 and reflector electrodes 1403 in which the electrode finger pitch is greater in the dummy region 1401, as shown in FIG. 14, for example. In this case, the propagation direction length of the busbar electrode 1410 connected to the electrode fingers of the comb-shaped electrode 1402 is greater than the propagation direction length of the first overlapping region 804 of the comb-shaped electrode 1402. This configuration can eliminate the second connection electrode fingers 808 and therefore the overlapping width can be reduced.

As discussed above, the effect of reduced spuriousness and other advantages can be achieved using a variety of configurations of the comb-shaped electrodes 102, 402, 502, 802, 1402. Still further, similar effects can be achieved in a longitudinal-mode-type elastic surface wave filter in which a plurality of comb-shaped electrodes 102, 402, 502, 802, 1402 are adjacently arranged in the propagation direction of an elastic wave.

As discussed above, in certain examples a Y-cut 128-degree $LiNbO_3$ substrate is used for the piezoelectric substrate of the elastic wave filter; however, embodiments of the elastic wave resonator are not limited in this regard, and other piezoelectric substrates can be used. For example, suppression of spuriousness in the transverse mode can be achieved by embodiments of the elastic wave filter of FIG. 8 using a $LiNbO_3$ substrate wherein the cut angle ranges from 120 degrees to 135 degrees in Y-cut, such that an elastic wave resonator having an improved characteristic can be realized.

In addition, the material of the electrodes is not limited to the specific examples disclosed herein, and a layered structure of high density electrodes with Aluminum-based materials, or a single layer electrode can be implemented.

In addition, the number of the comb-shaped electrodes and reflector electrodes and the electrode finger pitch are not limited to the specific example of FIG. 8. Although the second overlapping regions 805 provided on both sides in the overlapping width direction of the first overlapping region 804 are the same in some examples, the second overlapping regions 805 can be different in other examples. The similar effect can be achieved at least by configurations in which the frequency of an elastic wave excited by the second overlapping regions 805 is lower in comparison with that of an elastic wave excited by the first overlapping region.

Furthermore, the thickness of $SiO_2$ layer is not limited to this specific example and can be optimized according to the acoustic velocity of the primary elastic wave, other spuriousness, the cut angle, and the like. Still further, a similar effect can be achieved in embodiments of the elastic wave filter of FIG. 1 when a coating of the $SiO_2$ thin film is included.

It will be appreciated by those skilled in the art, given the benefit of this disclosure, that configuring a filter and an antenna duplexer to use embodiments of the elastic wave resonator 800 according to this disclosure can realize a filter and/or an antenna duplexer having less spuriousness in the transverse mode and improved characteristics, as well as a module and/or a communication device having enhanced performance using the same.

Figure 15:
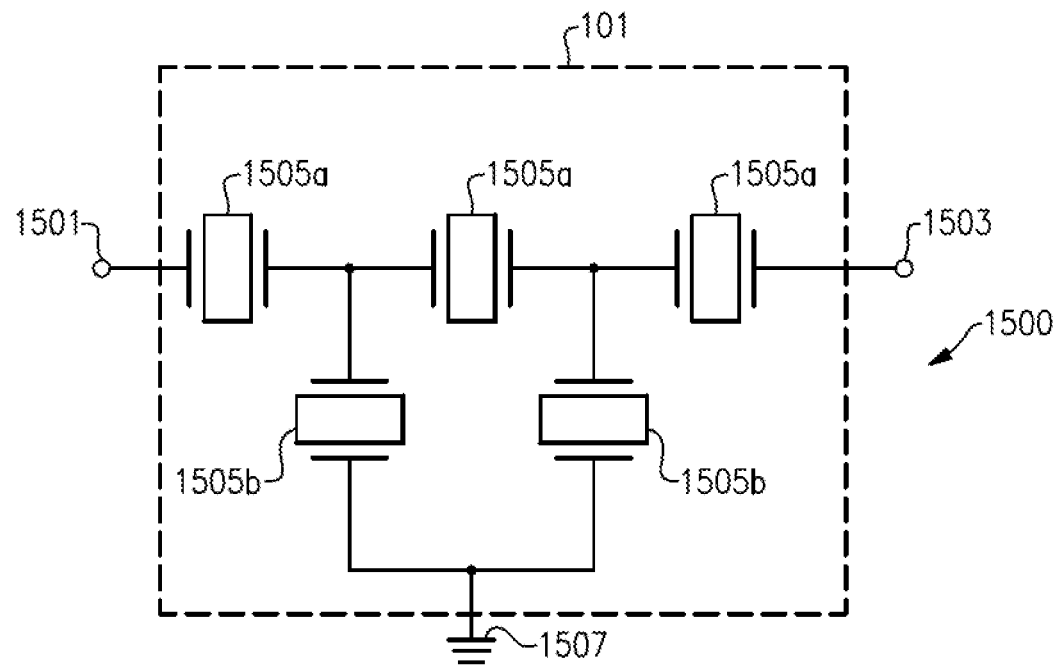
FIG. 15 is a diagram of an elastic wave filter including examples of the elastic wave resonator according to FIG. 1 and/or FIG. 8.

As discussed above, embodiments of the elastic wave resonator according to aspects of the present invention can achieve the effect of realizing an elastic wave resonator having less spuriousness and improved characteristics. Furthermore, configuring an elastic wave filter to use such an elastic wave resonator can achieve the effect of realizing an elastic wave filter having improved characteristics. FIG. 15 illustrates an example of a ladder-type elastic wave filter 1500 in which embodiments of the elastic wave resonator 100 and/or 800 may be used. The elastic wave filter 1500 includes one or more series arm resonators 1505a and one or more parallel arm resonators 1505b. In the example illustrated in FIG. 15, the elastic wave filter 1500 includes three series arm resonators 1505a and two parallel arm resonators 1505b; however, it is to be appreciated that embodiments of the elastic wave filter are not so limited and may include any number of series arm and parallel arm resonators. The series arm resonators 1505a are connected in series along a signal path between a first terminal 1501 and a second terminal 1503. The parallel arm resonators 1505b are connected between the signal path and a ground 1507. Any one or more of the series aim resonators 1505a and/or parallel arm resonators 1505b can be an embodiment of the elastic wave resonators 100 or 800 discussed above. Embodiments of the elastic wave resonators 100 and 800 can suppress spuriousness in the transmission characteristic of the elastic wave resonator, such that a downsized elastic wave resonator having improved characteristics can be realized. Embodiments of the elastic wave resonator 800 may also have an improved temperature characteristic. Accordingly, incorporation of one or more of these elastic wave resonators 100, 800 into the elastic wave filter 1500 can provide a filter having improved characteristics, such as smaller size, improved transmission characteristics (including reduced spuriousness), and improved temperature stability or performance, for example.

Figure 16:
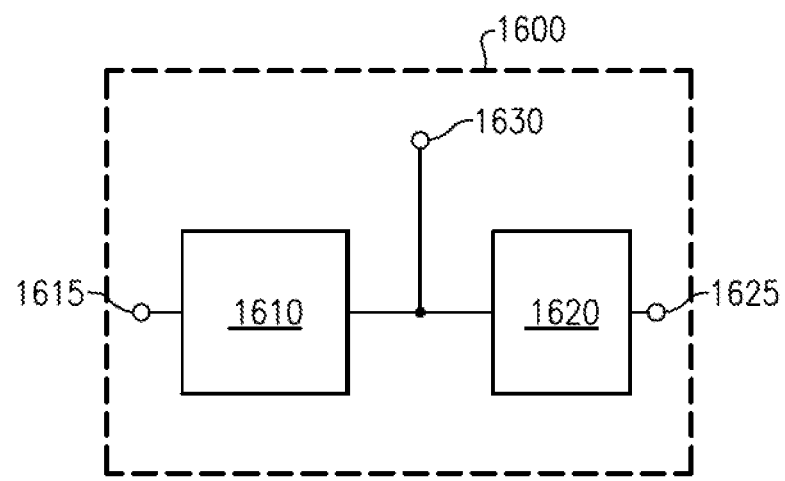
FIG. 16 is a block diagram of one example of an antenna duplexer including the elastic wave filter of FIG. 15, according to certain embodiments.

According to one embodiment, the elastic wave filter 1500 may be used to provide an antenna duplexer having improved characteristics. FIG. 16 illustrates a block diagram of one example of an antenna duplexer which may incorporate embodiments of the elastic wave filter 1500, and therefore embodiments of the elastic wave resonators 100 and/or 800. The antenna duplexer 1600 includes a transmission filter 1610 and a reception filter 1620 that are connected to a shared antenna terminal 1630. The transmission filter 1610 includes a transmission-side terminal 1615 for connecting the transmission filter to transmitter circuitry, and the reception filter includes a receive-side terminal 1625 for connecting the reception filter to receiver circuitry. Either or both of the transmission filter 1610 and the reception filter 1620 can be an embodiment of the elastic wave filter 1500. In an example in which the elastic wave filter 1500 is used as the transmission filter 1610, the first terminal 1501 of the elastic wave filter 1500 may correspond to the transmission-side terminal 1615, and the second terminal 1503 of the elastic wave resonator 1500 may correspond to the antenna terminal 1630. Similarly, in an example in which the elastic wave filter 1500 is used as the reception filter 1610, the first terminal 1501 of the elastic wave filter 1500 may correspond to the antenna terminal 1630, and the second terminal 1503 of the elastic wave resonator 1500 may correspond to the receive-side terminal 1625. By configuring the antenna duplexer 1600 to use the elastic wave filter 1500, which includes one or more of the elastic wave resonators 100 and/or 800, an antenna duplexer having improved characteristics and enhanced performance (resulting from the improved characteristics of the elastic wave resonators 100, 800 discussed above) can be realized.

Figure 17:
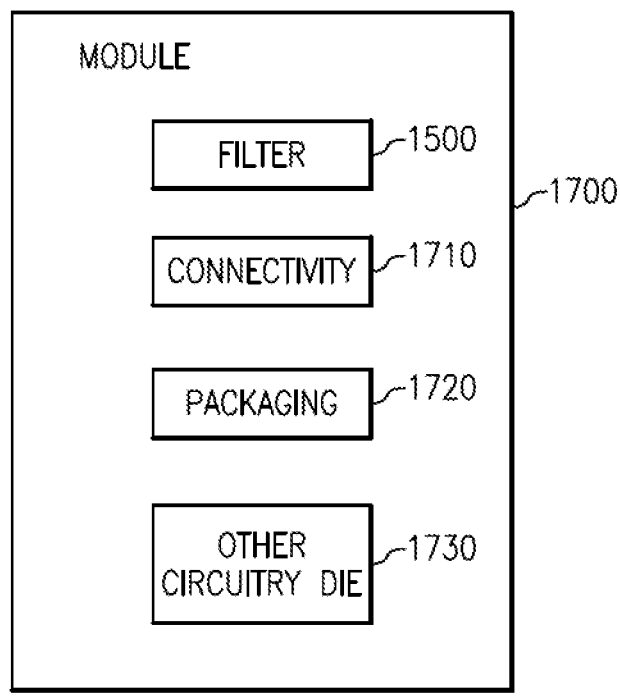
FIG. 17 is a block diagram of one example of a module incorporating the elastic wave filter of FIG. 15, according to certain embodiments.

As discussed above, embodiments of the elastic wave resonators 100, 800 may be incorporated, optionally as part of an elastic wave filter 1500 and/or antenna duplexer 1600, into a module that may ultimately be used in a device, such as a wireless communications device, for example, so as to provide a module having enhanced performance. FIG. 17 is a block diagram illustrating one example of a filter module 1700 including the elastic wave filter 1500 of FIG. 15. The module 1700 further includes connectivity 1710 to provide signal interconnections, packaging 1720, such as for example, a package substrate, for packaging of the circuitry, and other circuitry die 1730, such as, for example amplifiers, pre-filters, modulators, demodulators, down converters, and the like, as would be known to one of skill in the art of semiconductor fabrication in view of the disclosure herein. In certain embodiments, the elastic wave filter 1500 in module 1700 may be replaced with the antenna duplexer 1600, so as to provide an RF module, for example.

Figure 18:
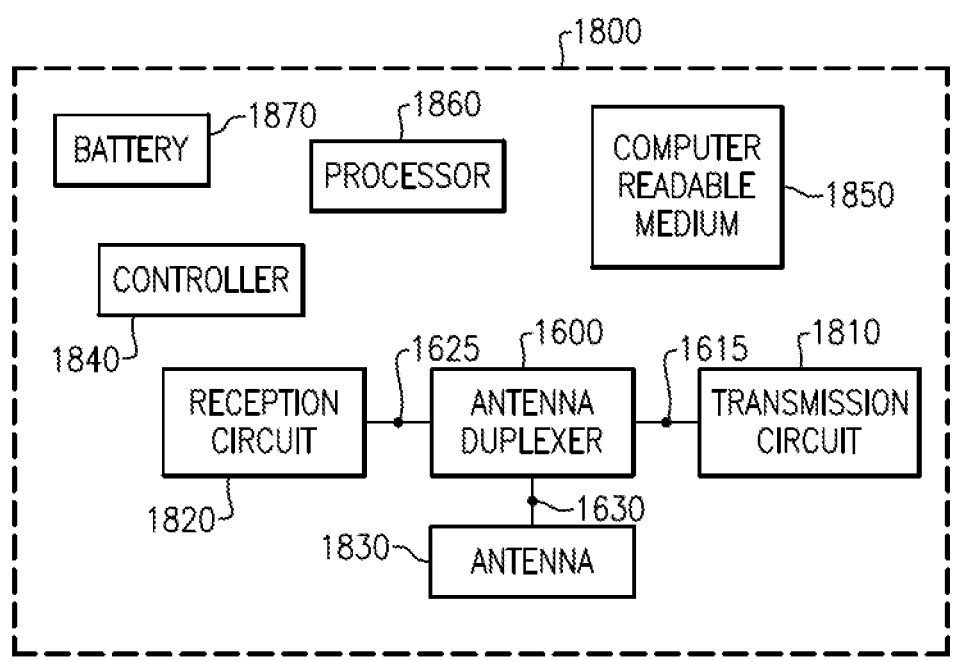
FIG. 18 is a block diagram of one example of a wireless communications device incorporating the antenna duplexer of FIG. 16, according to certain embodiments.

Furthermore, configuring an elastic wave filter and an/or antenna duplexer to use embodiments of the elastic wave resonator 100 and/or 800 can achieve the effect of realizing a communication device having enhanced performance using the same. FIG. 18 is a schematic block diagram of one example of a communication device 1800 (e.g., a wireless or mobile device) that can include the antenna duplexer 1600 incorporating one or more elastic wave resonators 100, 800, as discussed above. The communication device 1800 can represent a multi-band and/or multi-mode device such as a multi-band/multi-mode mobile phone, for example. In certain embodiments, the communication device 1800 can include the antenna duplexer 1600, a transmission circuit 1810 connected to the antenna duplexer via the transmission-side terminal 1615, a reception circuit 1820 connected to the antenna duplexer 1600 via the receive-side terminal 1625, and an antenna 1830 connected to the antenna duplexer via the antenna terminal 1630. The transmission circuit 1810 and reception circuit 1820 may be part of a transceiver that can generate RF signals for transmission via the antenna 1830 and can receive incoming RF signals from the antenna 1830. The communication device 1800 can further include a controller 1840, a computer readable medium 1850, a processor 1860, and a battery 1870.

It will be understood that various functionalities associated with the transmission and receiving of RF signals can be achieved by one or more components that are represented in FIG. 18 as the transmission circuit 1810 and the reception circuit 1820. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 18 as the antenna 1830. For example, a single antenna can be configured to provide both transmitting and receiving functionalities. In another example, transmitting and receiving functionalities can be provided by separate antennas. In yet another example in which the communication device is a multi-band device, different bands associated with the communication device 1800 can be provided with different antennas.

To facilitate switching between receive and transmit paths, the antenna duplexer 1600 can be configured to electrically connect the antenna 1830 to a selected transmit or receive path. Thus, the antenna duplexer 1600 can provide a number of switching functionalities associated with an operation of the communication device 1800. In addition, as discussed above, the antenna duplexer 1600 includes the transmission filter 1610 and reception filter 1620, which are configured to provide filtering of the RF signals. As discussed above, either or both of the transmission filter 1610 and reception filter 1620 can include embodiments of the elastic wave filter 1500 including one or more elastic wave resonators 100 and/or 800, and thereby provide enhanced performance through the benefits of reduced spuriousness and improved characteristics achieved using embodiments of the elastic wave resonators 100 and/or 800.

As shown in FIG. 18, in certain embodiments, a controller 1840 can be provided for controlling various functionalities associated with operations of the antenna duplexer 1600 and/or other operating component(s). In certain embodiments, a processor 1860 can be configured to facilitate implementation of various processes for operation of the communication device 1800. The processes performed by the processor 1860 may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create a mechanism for operating the communication device 1800. In certain embodiments, these computer program instructions may also be stored in the computer-readable medium 1850. The battery 1870 can be any suitable battery for use in the communication device 1800, including, for example, a lithium-ion battery.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An elastic wave resonator comprising:
   a piezoelectric substrate; and
   a pair of comb-shaped electrodes provided on an upper surface of the piezoelectric substrate, the pair of comb-shaped electrodes including first and second overlapping regions in which electrode fingers of the comb-shaped electrodes interdigitate, the second overlapping region being provided on both outside edges of the first overlapping region in an overlapping width direction, an overlapping width of the first overlapping region being greater than an overlapping width of the second overlapping region, an electrode finger pitch in the second overlapping region being greater than an electrode finger pitch in the first overlapping region, the first overlapping region including a first number of electrode fingers, and the second overlapping region including a second number of electrode fingers fewer than the first number of electrode fingers.

2. The elastic wave resonator of claim 1 wherein a frequency of a first elastic wave excited in the first overlapping region is higher than a frequency of a second elastic wave excited in the second overlapping region.

3. The elastic wave resonator of claim 1 wherein the electrode fingers in the first overlapping region and the electrode fingers in the second overlapping region are connected via first connection electrode fingers, the first connection electrode fingers being configured to obliquely extend with respect to a direction in which the electrode fingers extend in the first overlapping region.

4. The elastic wave resonator of claim 1 wherein the elastic wave resonator further includes a dummy region in which the electrode fingers of the pair of comb-shaped electrodes do not overlap with each other.

5. The elastic wave resonator of claim 4 wherein the electrode fingers of the comb-shaped electrodes in the first overlapping region and the electrode fingers of the comb-shaped electrodes in the second overlapping region are connected via first connection electrode fingers provided in a first connection region of the pair of comb-shaped electrodes, the electrode fingers of the second overlapping region and the electrode fingers of the dummy region being connected via second connection electrode fingers provided in a second connection region of the pair of comb-shaped electrodes, the first connection electrode fingers and the second connection electrode fingers obliquely extending with respect to a first direction in which the electrode fingers extend in the first overlapping region, and the first direction being opposite to a second direction in which the second connection electrode fingers obliquely extend.

6. The elastic wave resonator of claim 4 wherein the dummy region has an electrode finger pitch greater than the electrode finger pitch in the first overlapping region.

7. The elastic wave resonator of claim 6 wherein the electrode fingers of the pair of comb-shaped electrodes are connected to a busbar electrode having a length in an elastic wave propagation direction that is greater than a length in the elastic wave propagation direction of the first overlapping region.

8. The elastic wave resonator of claim 1 wherein a width of the electrode fingers in the second overlapping region is greater than a width of the electrode fingers in the first overlapping region.

9. The elastic wave resonator of claim 1 wherein the second overlapping region includes a first phase region and a second phase region, a phase of an elastic wave generated by electrode fingers of the first phase region being different from a phase of an elastic wave generated by electrode fingers of the second phase region.

10. The elastic wave resonator of claim 1 wherein the piezoelectric substrate is made of lithium niobate and has a cut angle ranging from 120 degrees to 135 degrees in Y-cut.

11. The elastic wave resonator of claim 1 further comprising a dielectric thin film made of $SiO_2$ disposed over the pair of comb-shaped electrodes.

12. An elastic wave filter having a plurality of elastic wave resonators, at least one of the elastic wave resonators including the elastic wave resonator of claim 1.

13. A module including the elastic wave filter of claim 12.

14. A communication device including the elastic wave filter of claim 12.

15. An antenna duplexer having a transmission filter and a reception filter, at least one of the transmission filter and the reception filter including the elastic wave filter of claim 12.

16. A module including the antenna duplexer of claim 15.

17. A communication device including the antenna duplexer of claim 15.

18. An elastic wave filter comprising:
    a piezoelectric substrate; and
    a plurality elastic wave resonators disposed on an upper surface of the piezoelectric substrate, each elastic wave resonator including a pair of comb-shaped electrodes having first and second overlapping regions in which electrode fingers of the comb-shaped electrodes interdigitate, the second overlapping region being provided on both outside edges of the first overlapping region in an overlapping width direction, an overlapping width of the first overlapping region being greater than an overlapping width of the second overlapping region, an electrode finger pitch in the second overlapping region being greater than an electrode finger pitch in the first overlapping region, the first overlapping region including a first number of electrode fingers, and the second overlapping region including a second number of electrode fingers fewer than the first number of electrode fingers.

19. The elastic wave filter of claim 18 wherein each of the plurality of elastic wave resonators further includes a dielectric film made of $SiO_2$ disposed over the pair of comb-shaped electrodes.

* * * * *

UNITED STATES PATENT AND TRADEMARK OFFICE
CERTIFICATE OF CORRECTION

PATENT NO. : 9,647,635 B2
APPLICATION NO. : 14/680486
DATED : May 9, 2017
INVENTOR(S) : Hiroyuki Nakamura et al.

It is certified that error appears in the above-identified patent and that said Letters Patent is hereby corrected as shown below:

In the Specification

Column 10, Line 49, delete "aim" and insert -- arm --.

Signed and Sealed this
Twentieth Day of June, 2017

Joseph Matal
*Performing the Functions and Duties of the*
*Under Secretary of Commerce for Intellectual Property and*
*Director of the United States Patent and Trademark Office*